(12) United States Patent
Han et al.

(10) Patent No.: US 9,658,272 B2
(45) Date of Patent: May 23, 2017

(54) METHOD AND DEVICE FOR DETERMINING THE DEFECT TYPE OF A PARTIAL DISCHARGE

(71) Applicants: Ki-Son Han, Daejeon (KR); Jin-Yul Yoon, Daejeon (KR); Hyung-Jun Ju, Daejeon (KR)

(72) Inventors: Ki-Son Han, Daejeon (KR); Jin-Yul Yoon, Daejeon (KR); Hyung-Jun Ju, Daejeon (KR)

(73) Assignee: KOREA ELECTRIC POWER CORPORATION, Seoul (KR)

( * ) Notice: Subject to any disclaimer, the term of this patent is extended or adjusted under 35 U.S.C. 154(b) by 530 days.

(21) Appl. No.: 14/345,163

(22) PCT Filed: Sep. 19, 2012

(86) PCT No.: PCT/KR2012/007482
§ 371 (c)(1),
(2) Date: Mar. 14, 2014

(87) PCT Pub. No.: WO2013/042928
PCT Pub. Date: Mar. 28, 2013

(65) Prior Publication Data
US 2014/0372052 A1    Dec. 18, 2014

(30) Foreign Application Priority Data

Sep. 19, 2011 (KR) .................. 10-2011-0094159

(51) Int. Cl.
*G01R 31/12* (2006.01)
(52) U.S. Cl.
CPC .................. *G01R 31/12* (2013.01)

(58) Field of Classification Search
CPC ...................................................... G01R 31/12
See application file for complete search history.

(56) References Cited

FOREIGN PATENT DOCUMENTS

KR    2012-0000228 A    1/2012

OTHER PUBLICATIONS

Hans-Gerd Kranz, Diagnosis of Partial Discharge Signals Using Neural Networks and Minimum Distance Classification, Dec. 1993, IEEE Transactions on Electrical Insulation, vol. 28, No. 6, pp. 1016-1024.*

(Continued)

*Primary Examiner* — Toan Le
(74) *Attorney, Agent, or Firm* — McDermott Will & Emery LLP

(57) ABSTRACT

The present invention relates to a method and device for determining the defect type of a partial discharge, the method including the steps of: forming virtual spaces corresponding to n parameters generated on the basis of defect types that cause a partial discharge; arranging defect type models in the virtual spaces based on the parameter values of the n parameters; extracting parameter values of the n parameters based on a partial discharge event; arranging a partial discharge model in the virtual space based on the parameter values; calculating the distance value between the defect type models and the partial discharge model based on the position information of the defect type models and the partial discharge model; calculating the probability of the defect types based on the calculated distance value; and determining the defect type based on the probability of the defect types for the partial discharge signal event.

13 Claims, 10 Drawing Sheets

(56) References Cited

OTHER PUBLICATIONS

Sun-Geun Goo et al., "Auto-classification of UHF partial discharge signal without phase signal," The Korean Institute of Electrical Engineers, Journal of Summer Conference, 2005 (w/English Abstract).
Seong-Il Kim et al., "A Study on Optimization of Partial Discharge Pattern Recognition using Genetic Algorithm," The Korean Institute of Electrical Engineers, Electrical Property, Application Part Society, Journal of Fall Conference, 2006 (w/English Abstract).
Search Report issued in International Application No. PCT/KR2012/007482, dated Feb. 6, 2013.

\* cited by examiner

| DISTRIBUTION | POLARITY | PARAMETER |
|---|---|---|
| PHI-Q | POSITIVE | MAXIMUM |
| | | MINIMUM |
| | | STD. DEV. |
| | | SKEWNESS |
| | | KURTOSIS |
| | NEGATIVE | MAXIMUM |
| | | MINIMUM |
| | | STD. DEV. |
| | | SKEWNESS |
| | | KURTOSIS |
| PHI-N | POSITIVE | MAXIMUM |
| | | MINIMUM |
| | | STD. DEV. |
| | | SKEWNESS |
| | | KURTOSIS |
| | NEGATIVE | MAXIMUM |
| | | MINIMUM |
| | | STD. DEV. |
| | | SKEWNESS |
| | | KURTOSIS |
| Q-N | NONE | MAXIMUM |
| | | MINIMUM |
| | | STD. DEV. |
| | | SKEWNESS |
| | | KURTOSIS |

FIG. 3

| DEFECT TYPE | PARAMETER VALUE |
|---|---|
| PARTICLE | $p_1, p_2, p_3, \cdots p_n$ |
| FLOATING | $f_1, f_2, f_3, \cdots f_n$ |
| CORONA | $c_1, c_2, c_3, \cdots c_n$ |
| VOID | $v_1, v_2, v_3, \cdots v_n$ |
| NOISE | $n_1, n_2, n_3, \cdots n_n$ |

METHOD AND DEVICE FOR DETERMINING THE DEFECT TYPE OF A PARTIAL DISCHARGE

RELATED APPLICATIONS

This application is the U.S. National Phase under 35 U.S.C. §371 of International Application No. PCT/KR2012/007482, filed on Sep. 19, 2012, which in turn claims the benefit of Korean Application No. 10-2011-0094159, filed on Sep. 19, 2011, the disclosures of which Applications are incorporated by reference herein.

TECHNICAL FIELD

The present relates generally to a method and apparatus for determining the type of defect in partial discharge and, more particularly, to a method and apparatus for determining the type of defect in partial discharge, which utilize a new defect type determination technique required to compensate for the vulnerabilities of a neural network-based defect type determination technique.

BACKGROUND ART

Determination methods for identifying types of defects are installed as the core part of software in Ultra-High Frequency (UHF) partial discharge diagnosis online systems and portable equipment which are currently used for Gas Insulated Switchgear (GIS) defect prevention.

This determination method for defect identification indicates determination results in the form of the probability of matching predefined defect types using a neural network, and such a neural network determines the type of defect in a detected partial discharge signal using several hundreds or more pieces of training data obtained based on phase, discharge quantity, the number of discharges, etc.

A neural network determination method that is currently used has fundamental problems in that the precision of defect type determination is greatly deteriorated in parameters based on untrained patterns, and the type of defect is falsely determined to be an incorrect defect type, and thus determination for all potential defects must be simulated and trained.

In particular, in online systems, a large number of events occur, and a lot of manpower and time are required to individually check and analyze such events. In many cases, even portable equipment indicates incorrect defect types as results. In this case, similar to online systems, a lot of manpower and time are required to determine the states of devices, and there is a possibility to falsely cope with defects, so that, if a defect is determined to be noise, the occurrence of failures cannot be previously prevented, whereas if noise is determined to be a defect, economic loss attributable to excessive inspections may be caused.

DISCLOSURE

Technical Problem

An object of the present invention is to provide a method and apparatus for determining the type of defect in partial discharge, which utilize a new defect type determination technique for compensating for the fundamental vulnerabilities of a neural network-based defect type determination method used in existing partial discharge diagnosis systems and equipment in which the precision of determination is greatly deteriorated and in which a defect is determined to be an incorrect type of defect.

Another object of the present invention is to provide a method and apparatus for determining the type of defect in partial discharge, which assign weights so that the present invention is used together with an existing neural network-based determination method, thus improving the precision of defect type determination.

Technical Solution

A method for determining a type of defect in partial discharge according to an embodiment of the present invention to accomplish the above objects includes forming a virtual space corresponding to n parameters generated based on defect types causing partial discharge, and arranging defect type models in the virtual space by combining parameter values of the n parameters for each of defect types, extracting parameter values corresponding to the n parameters based on a generated partial discharge signal when a partial discharge signal event occurs, combining the parameter values, and then arranging a partial discharge model in the virtual space, comparing pieces of location information of the defect type models with location information of the partial discharge model and then calculating distance values between the defect type models and the partial discharge model, calculating probability values of the defect types for the partial discharge signal event from the distance values calculated at calculating, and determining a type of defect in the partial discharge signal event based on the probability values of the defect types for the partial discharge signal event.

The virtual space may be an n-dimensional space composed of n axes respectively corresponding to the n parameters.

Arranging the defect types may include may include arranging the parameter values for each of the defect types in the virtual space and, if the parameter values form groups having predetermined distributions, calculating coordinate values at center locations of the corresponding groups for respective defect types, and storing the calculated coordinate values for respective defect types as the pieces of location information of the respective defect type models.

Calculating the probability values of the defect types may be configured to calculate a ratio of relative distances for respective defect types based on a total distance value to the defect types, thus calculating the probability values.

The probability values may become higher as the distance values between the partial discharge model and the defect type models are shorter.

The method may further include receiving neural network-based defect type determination results for the defect types and the partial discharge signal event.

Determining the type of defect may be configured to determine the type of defect in the partial discharge signal event by combining the probability values of the defect types with probability values acquired from the neural network-based defect type determination results.

Determining the type of defect may be configured to assign different weights to the probability values of the defect types and to the probability values acquired from the neural network-based defect type determination results.

Determining the type of defect may be configured to determine the type of defect in the partial discharge signal event by adding up the probability values of the defect types and the probability values acquired from the neural network-based defect type determination results, to which the different weights have been assigned.

The parameters may be generated based on phase, discharge quantity, and a number of discharges of the partial discharge signal measured in correspondence with each of the defect types.

The parameters may be classified into two-dimensional (2D) distributions corresponding to three types including phase-discharge quantity, phase—the number of discharges, and discharge quantity—the number of discharges by using the phase, the discharge quantity, and the number of discharges as variables.

Each of the phase-discharge quantity-type parameters and the phase—the number of discharges-type parameters may have phase as a dependent variable, and may be then divided into positive and negative parameters.

The discharge quantity—the number of discharges-type parameters may have dependent variables having linear characteristics, and are then normalized by setting a maximum value to 100.

The type of defect in partial discharge may include at least one of particle, floating, corona, void, and noise defects.

Meanwhile, a method for determining a type of defect in partial discharge according to an embodiment of the present invention to accomplish the above objects includes a virtual space implementation unit for forming a virtual space corresponding to n parameters generated based on defect types causing partial discharge, a partial discharge signal analysis unit for, when a partial discharge signal event occurs, extracting parameter values corresponding to the n parameters, based on a generated partial discharge signal, a calculation unit for comparing pieces of location information of defect type models, arranged in the virtual space by combining the parameter values of the n parameters for each of the defect types, with location information of a partial discharge model, arranged in the virtual space by combining the parameter values of the n parameters for the partial discharge signal, calculating distance values between the defect type models and the partial discharge model, and calculating probability values of the defect types for the partial discharge signal event from the distance values, and a defect type determination unit for determining a type of defect in the partial discharge signal event based on the probability values of the defect types for the partial discharge signal event.

The defect type determination unit may receive neural network-based defect type determination results for the defect types and the partial discharge signal event, and determine the type of defect in the partial discharge signal event by combining the probability values of the defect types with probability values acquired from the neural network-based defect type determination results.

The defect type determination unit may assign different weights to the probability values of the defect types and to the probability values acquired from the neural network-based defect type determination results.

The defect type determination unit may determine the type of defect in the partial discharge signal event by adding up the probability values of the defect types and the probability values acquired from the neural network-based defect type determination results, to which the different weights have been assigned.

Advantageous Effects

In accordance with an embodiment of the present invention, there is an advantage in that the vulnerabilities of an existing neural network-based defect type determination technique may be compensated for, and the precision of defect type determination may be improved.

In accordance with an embodiment of the present invention, an error in which an actual defect is falsely determined to be noise may be minimized, thus preventing the occurrence of failures, and reducing economic loss caused by excessive inspections.

DESCRIPTION OF DRAWINGS

FIG. 3 is a diagram illustrating examples of parameters according to an embodiment of the present invention;

BEST MODE

Hereinafter, embodiments of the present invention will be described in detail with reference to the attached drawings.

Figure 1:
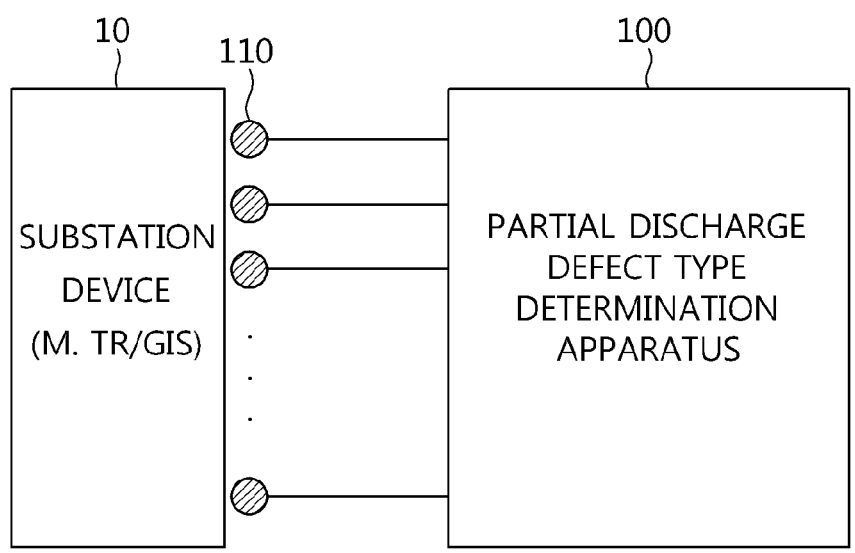
FIG. 1 is a diagram showing the basic concept of an apparatus for determining the type of defect in partial discharge according to an embodiment of the present invention.

FIG. 1 is a diagram showing the basic concept of an apparatus for determining the type of defect in partial discharge according to an embodiment of the present invention. As shown in FIG. 1, the apparatus for determining the type of defect in partial discharge according to an embodiment of the present invention includes sensors connected to an external substation device and is configured to analyze signals detected by the respective sensors and determine the type of defect in partial discharge.

The detailed configuration of an apparatus for determining the type of defect in partial discharge according to an embodiment of the present invention will be described in detail with reference to FIG. 2.

Figure 2:
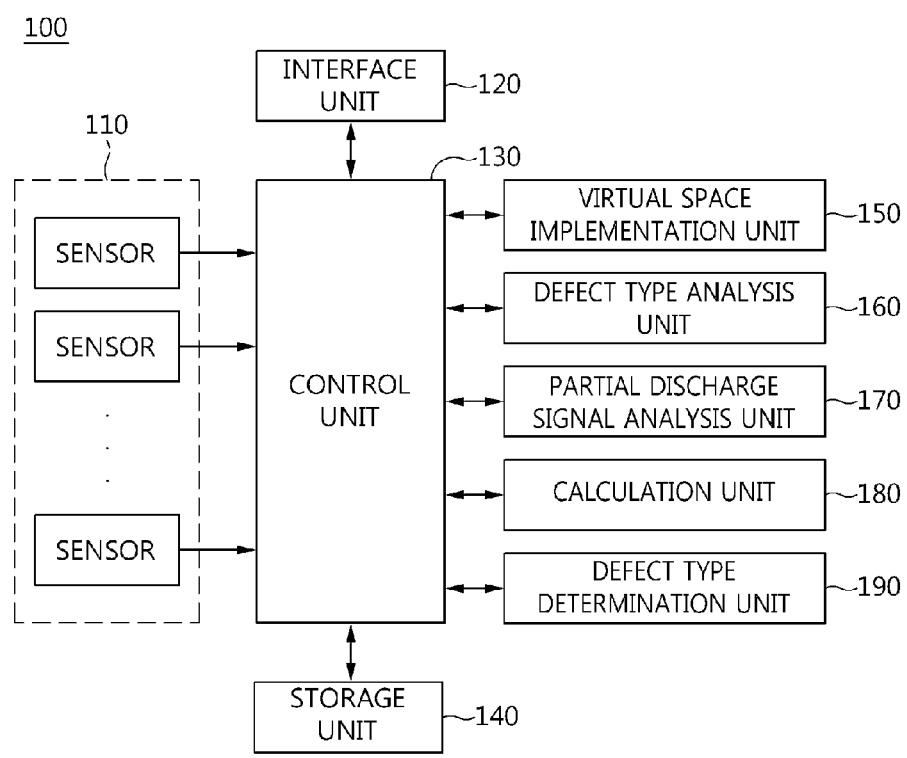
FIG. 2 is a block diagram showing the configuration of an apparatus for determining the type of defect in partial discharge according to an embodiment of the present invention.

FIG. 2 is a block diagram showing the configuration of an apparatus for determining the type of defect in partial discharge according to an embodiment of the present invention.

As shown in FIG. 2, the apparatus for determining the type of defect in partial discharge according to an embodiment of the present invention includes a sensor unit 110, an interface unit 120, a control unit 130, a storage unit 140, a defect type analysis unit 160, a virtual space implementation unit 150, a partial discharge signal analysis unit 170, a calculation unit 180, and a defect type determination unit 190.

First, the sensor unit 110 includes a plurality of sensors connected to a substation device, as shown in FIG. 1, and configured to detect a partial discharge signal output from the substation device. In this case, the sensors for detecting the partial discharge signal transmit a partial discharge signal event together with the partial discharge signal to the control unit 130.

The defect type analysis unit 160 is a means for setting a reference value required to determine the type of defect in partial discharge, and is configured to generate n parameters for one or more defect types.

In this case, the defect type analysis unit 160 generates n parameters based on the phase (Phi), discharge quantity (q), and the number of discharges (n) of the partial discharge signal measured in correspondence with defect types, and a detailed description thereof will be made with reference to FIG. 3.

Information about individual defect types and the n parameters generated by the defect type analysis unit 160 are stored in the storage unit 140.

Figures 4, 5:
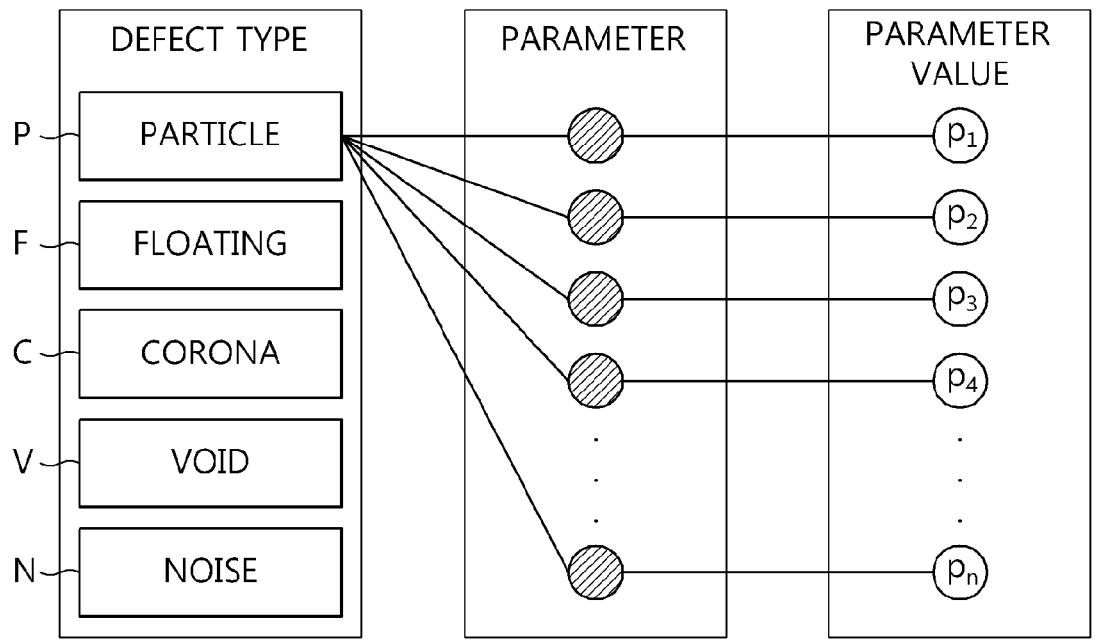
FIG. 4 is an exemplary diagram referred to in explaining the operation of calculating parameter values for each defect type according to an embodiment of the present invention.
FIG. 5 is a diagram illustrating parameter values for each defect type according to an embodiment of the present invention.

Further, the defect type analysis unit 160 calculates n parameter values for each of the defect types using the information about the defect types and the n parameters which are stored in the storage unit 140. The configuration for calculating the n parameter values for each defect type will be described in detail later with reference to FIG. 4. The parameter values for each defect type calculated via the procedure of FIG. 4 are described with reference to FIG. 5. Similarly, the parameter values for each defect type shown in FIG. 5 are stored in the storage unit 140.

The virtual space implementation unit 150 forms a virtual space corresponding to the n parameters generated based on defect types causing partial discharge. In this case, the virtual space denotes an n-dimensional space composed of n axes respectively corresponding to the n parameters.

An embodiment of the present invention intends to describe the virtual space based on the embodiment of FIG. 3. In other words, the number of parameters generated in FIG. 3 is 25. Therefore, the virtual space implementation unit 150 forms a 25-dimensional virtual space composed of 25 axes corresponding to the respective parameters. In this case, the different parameters correspond to the respective 25 axes.

Further, the virtual space implementation unit 150 arranges defect type models in the virtual space by combining parameter values corresponding to the n parameters for each defect type. In this case, the virtual space implementation unit 150 is configured to arrange individual parameter values for each defect type in the virtual space, and is configured to, if groups in which individual parameter values have a predetermined distribution are formed, calculate coordinate values of the center locations of the corresponding groups for respective defect types. In this case, the defect type models are arranged at the coordinate values of the center locations.

Therefore, the virtual space implementation unit 150 stores the coordinate values calculated for respective defect types as pieces of location information of the respective defect type models in the storage unit 140. The defect type models are arranged for the respective defect types. The operation of arranging the defect type models for respective defect types will be described in detail later with reference to FIG. 6.

Meanwhile, the partial discharge signal analysis unit 170 is configured to, when a partial discharge signal event occurs, analyze a generated partial discharge signal, and extract parameter values corresponding to the n parameters based on the results of analysis. A detailed operation related to this will be described in detail later with reference to FIG. 7.

In this case, the virtual space implementation unit 150 arranges a partial discharge model in the n-dimensional virtual space by combining the n parameter values extracted by the partial discharge signal analysis unit 170. The operation of arranging the partial discharge model based on the partial discharge signal event will be described in detail later with reference to FIG. 8.

The calculation unit 180 calculates distance values between the defect type models and the partial discharge model by comparing the pieces of location information of the defect type models with the location information of the partial discharge model. A formula required to calculate the distance values between the defect type models and the partial discharge model is represented by the following Equation 1:

$$D_c = \sqrt{(c_{Op1} - e_{1p1})^2 + (c_{Op2} - e_{1p2})^2 + (c_{Op3} - e_{1p3})^2 \ldots (c_{Op25} - e_{1p25})^2} \quad (1)$$

Equation 1 denotes the formula for calculating a distance between a corona defect type model and the partial discharge model, and c0p1, c0p2, c0p3, . . . , c0p25 denote the coordinate values of the center locations of respective parameter dimensions of the corona defect type. Further, c1p1, e1p2, e1p3, . . . , e1p25 denote the coordinate values of the center locations of the respective parameter dimensions of a first partial discharge signal.

Further, the calculation unit 180 calculates the probability values of the defect types for the partial discharge signal event from the calculated distance values. A formula required to calculate the probability values of the defect types for the partial discharge signal event from the distances is represented by the following Equation 2:

$$P = \frac{D_{major}}{\sqrt{(D_c)^2 + (D_f)^2 + (D_c)^2 + (D_p)^2 + (D_n)^2}} \quad (2)$$

where Dp, Df, Dc, Dv, and Dn denote distance values between the partial discharge model and the respective defect type models, and $D_{major}$ denotes distance values between the partial discharge model and a major defect type. The above Equation 2 is not an absolute formula, and the probability value according to an embodiment of the present invention may be calculated based on the ratio of individual distance values.

In this case, the calculation unit 180 calculates the probability values by calculating the ratio of relative distances for respective defect types based on the total distance to the defect types. Here, as the distance values between the partial discharge model and the defect type models are shorter, higher probability values are obtained. In other words, as a value of P is smaller, a higher probability value is obtained. For example, when P=0, a probability value becomes 100%.

The defect type determination unit 190 determines the type of defect in a partial discharge signal event based on the probability values of the defect types for the partial discharge signal event.

Further, the defect type determination unit 190 may determine the type of defect in partial discharge in cooperation with an existing neural network-based defect type determination technique.

In other words, the defect type determination unit 180 may receive the results of neural network-based defect type determination for the corresponding partial discharge signal event from an external system, and may determine the type of defect in the partial discharge signal event by combining probability values acquired from the received neural network-based defect type determination results with the probability values calculated by the calculation unit 180.

In this case, the defect type determination unit 180 assigns different weights to the probability values of the defect types and to the probability values acquired from the neural network-based defect type determination results, and adds up probability values, in which a weight is assigned to the probability values from the neural network-based defect type determination results, and probability values, in which a weight is assigned to the probability values of the defect types calculated by the calculation unit 180, and thus determines the type of defect in the partial discharge signal event. A description of a detailed configuration related to this will be made with reference to the embodiment of FIG. 9.

FIG. 3 is a diagram illustrating examples of parameters according to an embodiment of the present invention.

As shown in FIG. 3, the defect type analysis unit 160 generates parameters based on the phase (Phi), discharge quantity (q), and the number of discharges (n) of a partial discharge signal measured in correspondence with each of the defect types.

In this case, the defect type analysis unit 160 classifies the parameters into three types of two-dimensional (2D) distributions corresponding to phase-discharge quantity (Phi-q), phase—the number of discharges (Phi-n), and discharge quantity—the number of discharges (q-n) by using phase, discharge quantity, and the number of discharges as variables. Here, since the phase-discharge quantity (Phi-q) parameter and the phase—the number of discharges (Phi-n)-type parameter have phase as an independent variable, each of the parameters is classified into positive parameters and negative parameters.

Therefore, in the embodiment of FIG. 3, the defect type analysis unit 160 classifies each of the phase-discharge quantity (Phi-q)-type parameter and the phase—the number of discharges (Phi-n)-type parameter into positive features and negative features, and generates Maximum, Minimum, Standard Deviation (Std. Dev.), Skewness, and Kurtosis parameters for each of the positive and negative features.

Meanwhile, since the discharge quantity—the number of discharges (q-n)-type parameters have dependent variables having linear characteristics, polarities are not taken into consideration. However, the maximum value of the parameters is set to 100, and thus the parameters are normalized.

Therefore, the defect type analysis unit 160 generates Maximum, Minimum, Std. Dev., Skewness, and Kurtosis parameters without separately dividing the polarities of the discharge quantity—the number of discharges (q-n)-type parameters.

In this way, for each of the positive and negative polarities of the phase-discharge quantity (Phi-q)-type, for each of the positive and negative polarities of the phase—the number of discharges (Phi-n)-type, and for the discharge quantity—the number of discharges (q-n)-type, Maximum, Minimum, Std. Dev., Skewness, and Kurtosis parameters are generated, and thus a total of 25 parameters are generated.

Of course, a reference for the generation of parameters or the number of generated parameters may be changed depending on settings, and such reference is not necessarily limited to any one reference.

FIG. 4 is an exemplary diagram referred to in explaining the operation of calculating parameter values for each defect type according to an embodiment of the present invention.

As shown in FIG. 4, the defect type analysis unit 160 generates parameter values by applying a partial discharge signal based on defect types stored in the storage unit 140 to individual parameters.

As an example, when defect types are assumed to be particle, floating, corona, void, and noise, the corresponding signal is first individually applied to n parameters in relation to a particle defect type, and thus n parameter values such as p1, p2, p3, . . . , pn are calculated.

This procedure is performed identically on each of floating, corona, void, and noise defect types, so that, for each defect type, n parameter values are calculated.

The parameter values generated for each defect type are shown in FIG. 5.

FIG. 5 is a diagram illustrating parameter values for each defect type according to an embodiment of the present invention.

As described above with reference to FIG. 4, the defect type analysis unit 160 calculates parameter values, that is, p1, p2, p3, . . . , pn, corresponding to n parameters from the partial discharge signal based on particles. Similarly, the defect type analysis unit 160 calculates parameter values, that is, f1, f2, f3, . . . , fn, corresponding to n parameters from a partial discharge signal based on floating. Further, the defect type analysis unit 160 calculates n parameter values, that is, c1, c2, c3, . . . , cn, from a partial discharge signal based on corona, calculates n parameter values, that is, v1, v2, v3, . . . , vn, from a partial discharge signal based on voids, and also calculates n parameter values, that is, n1, n2, n3, . . . , nn, from a partial discharge signal based on noise.

Figure 6:
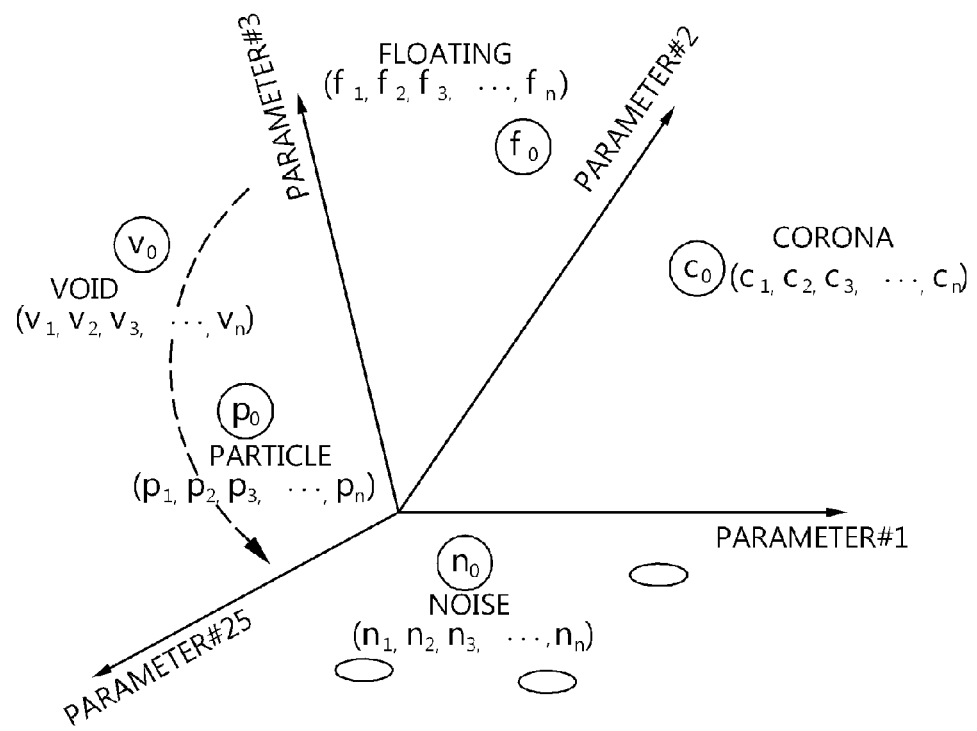
FIG. 6 is a diagram illustrating defect type models arranged in a virtual space according to an embodiment of the present invention.

FIG. 6 is a diagram illustrating defect type models arranged in a virtual space according to an embodiment of the present invention. As shown in FIG. 6, if it is assumed that the number of parameters generated in FIG. 3 is 25, the number of axes in the virtual space is 25.

In this case, in order to arrange a particle defect type model, the virtual space implementation unit 150 arranges 25 parameter values, calculated for a particle defect type, on the 25 respective axes, and arranges the particle defect type model at the coordinate values of a center location at which the parameter values on the respective axes are combined. The particle defect type model is indicated by p0.

Meanwhile, in order to arrange a floating defect type model, the virtual space implementation unit 150 arranges 25 parameter values, calculated for a floating defect type, on the 25 respective axes, and arranges the floating defect type model at the coordinate values of a center location at which the parameter values on the respective axes are combined. The floating defect type model is indicated by f0.

Further, the virtual space implementation unit 150 equally performs the above procedure even for each of corona, void, and noise defect types, and thus arranges a corona defect type model, a void defect type model, and a noise defect type model in the virtual space. In this case, the corona defect type model is indicated by c0, the void defect type model is indicated by v0, and the noise defect type model is indicated by n0.

Figure 7:
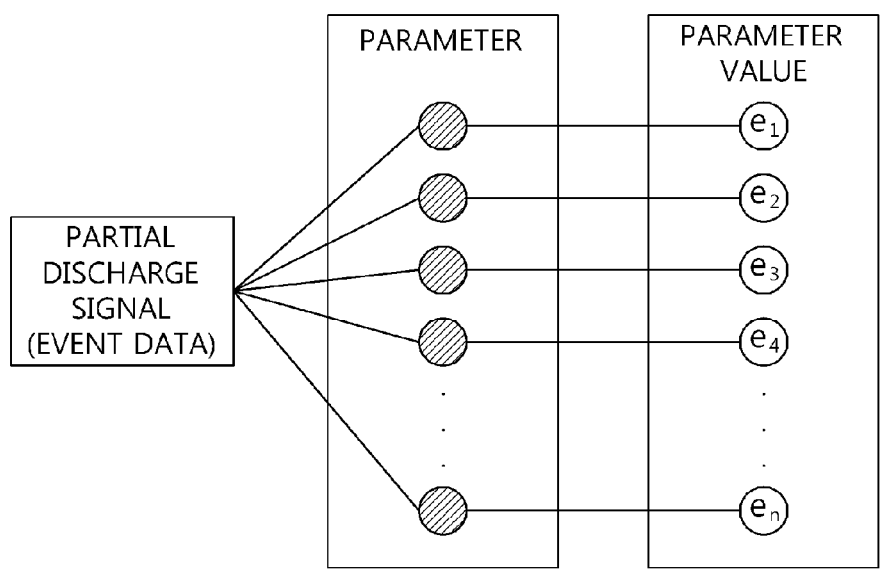
FIG. 7 is an exemplary diagram referred to in explaining the operation of calculating parameter values of a partial discharge signal according to an embodiment of the present invention.

FIG. 7 is an exemplary diagram referred to in explaining the operation of calculating the parameter values of a partial discharge signal according to an embodiment of the present invention.

As shown in FIG. 7, the partial discharge signal analysis unit 170 generates parameter values by applying a partial discharge signal detected by sensors to individual parameters.

As an example, the partial discharge signal analysis unit 170 individually applies the corresponding partial discharge signal to n parameters, and, as a result of the application, calculates n parameter values such as $c_1, c_2, c_3, \ldots, c_n$.

In this case, the virtual space implementation unit 150 combines the n individual parameters for the partial discharge signal calculated in FIG. 7, and then arranges a partial discharge model corresponding to a given partial discharge signal event in an n-dimensional virtual space. An embodiment related thereto will be described with reference to FIG. 8.

Figure 8:
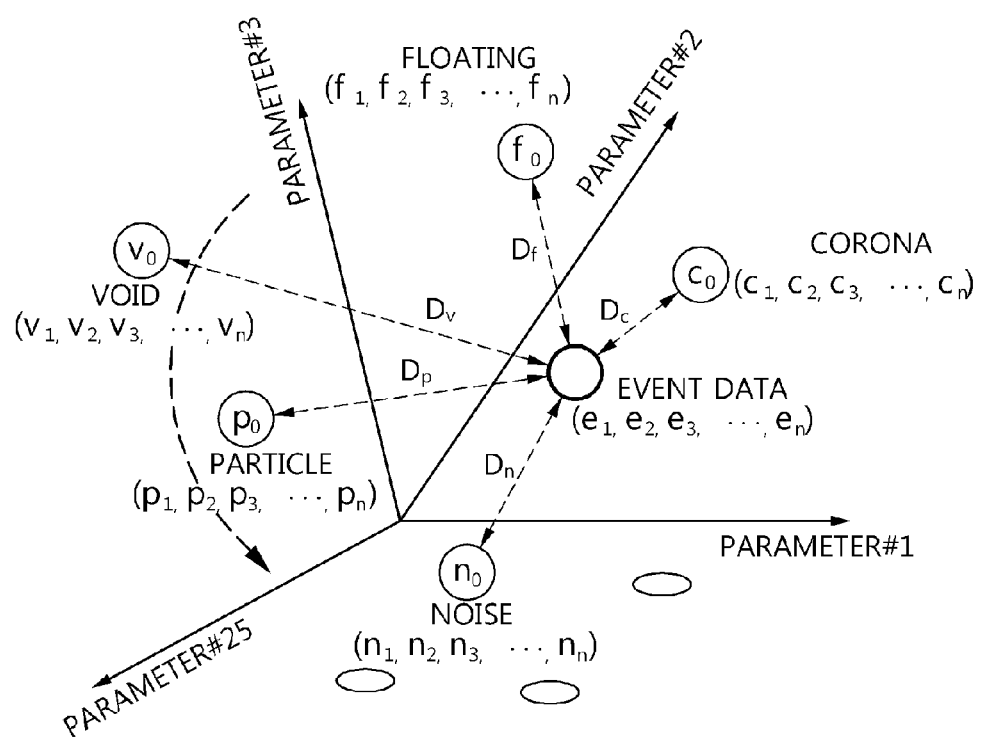
FIG. 8 is a diagram illustrating showing a partial discharge model arranged in a virtual space according to an embodiment of the present invention.

FIG. 8 is a diagram illustrating a partial discharge model arranged in a virtual space according to an embodiment of the present invention.

If it is assumed that, similar to the embodiment of FIG. 6, the number of parameters generated in the embodiment of FIG. 8 is 25, the number of axes of the virtual space is 25.

In this case, the virtual space implementation unit 150 is configured to, when a partial discharge signal event occurs, arrange a partial discharge model in the virtual space in which a particle defect type model, a floating defect type model, a corona defect type model, a void defect type model, and a noise defect type model are arranged.

Here, the virtual space implementation unit 150 arranges 25 parameter values, calculated for the partial discharge signal, on the 25 respective axes, and arranges the partial discharge model at the coordinate values of a center location at which the parameter values on the respective axes are combined. The partial discharge model is indicated by e0.

Thereafter, the calculation unit 180 calculates distance values from the partial discharge model arranged in the virtual space to the particle defect type model, the floating defect type model, the corona defect type model, the void defect type model, and the noise defect type model.

The distance values between the partial discharge model and the individual defect type models are calculated using the above Equation 1.

In this case, a distance value between the partial discharge model and the particle defect type model is defined by Dp, a distance between the partial discharge model and the floating defect type model is defined by Df, a distance value between the partial discharge model and the corona defect type model is defined by Dc, a distance value between the partial discharge model and the void defect type model is defined by Dv, and a distance value between the partial discharge model and the noise defect type model is defined by Dn.

The distance values Dp, Df, Dc, Dv, and Dn between the partial discharge model and the individual defect type models are used to calculate the probability values of the respective defect types for the partial discharge signal.

Figure 9:
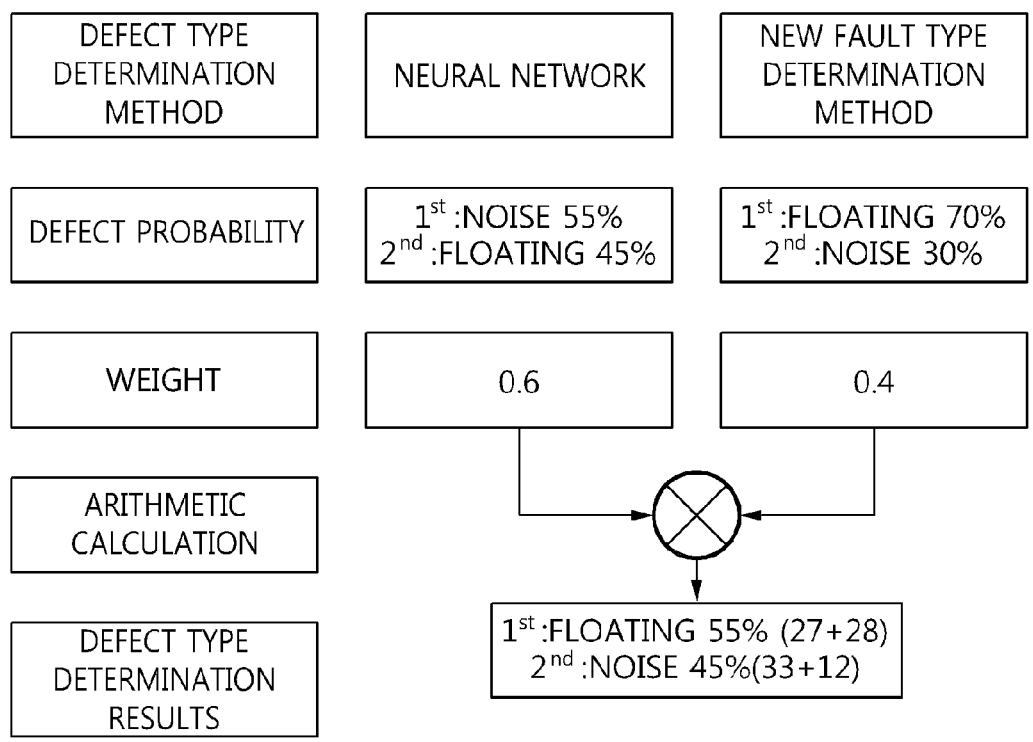
FIG. 9 is an exemplary diagram referred to in explaining the operation of determining the type of defect in partial discharge according to an embodiment of the present invention.

FIG. 9 is an exemplary diagram referred to in explaining the operation of determining the type of defect in partial discharge according to an embodiment of the present invention.

As shown in FIG. 9, the apparatus for determining the type of defect in partial discharge according to an embodiment of the present invention may determine the type of defect in partial discharge in cooperation with an existing neural network-based defect type determination technique.

In other words, the apparatus for determining the type of defect in partial discharge may receive the results of neural network-based defect type determination for the corresponding partial discharge signal event, and combine the received neural network-based defect type determination results with the probability values calculated by the calculation unit 180, and thus determine the type of defect in the partial discharge signal event.

Although the embodiment of the present invention has been described as externally receiving the neural network-based defect type determination results, it is possible to additionally perform such neural network-based defect type determination within the apparatus for determining the type of defect in partial discharge according to an embodiment of the present invention, without externally receiving the neural network-based defect type determination results.

In greater detail, the defect type determination unit 180 combines probability values of defect types calculated by the calculation unit 180 with probability values acquired from the neural network-based defect type determination results, and thus determines the type of defect in the corresponding partial discharge signal event. In this case, the defect type determination unit 180 may assign different weights to the probability values of the defect types and to the probability values acquired from the neural network-based defect type determination results.

In an embodiment, the defect type determination unit 180 may assign a weight of 0.6 to the probability value acquired from the neural network-based defect type determination results, and a weight of 0.4 to the probability values of the defect types calculated by the calculation unit 180.

In this case, if it is assumed that, for the probability values of the defect types acquired from the neural network-based defect type determination results, a probability value of noise is 55% and a probability value of floating is 45%, and for the probability values of the defect types calculated by the calculation unit 180, a probability value of floating is 70% and a probability value of noise is 30%, the probability values from the neural network-based defect type determination results may be 33% for noise and 27% for floating. In contrast, the probability values of the defect types calculated by the calculation unit 180 may be 28% for floating and 12% for noise.

In this regard, the defect type determination unit 180 finally determines the probability value of floating to be 55% by adding up the probability value of 27% for floating acquired from the neural network-based defect type determination results and the probability value of 28% for floating calculated by the calculation unit 180.

Further, the defect type determination unit 180 finally determines the probability value of noise to be 45% by adding up the probability value of 33% for noise acquired from the neural network-based defect type determination results and the probability value of 12% for noise calculated by the calculation unit 180.

Figure 10:
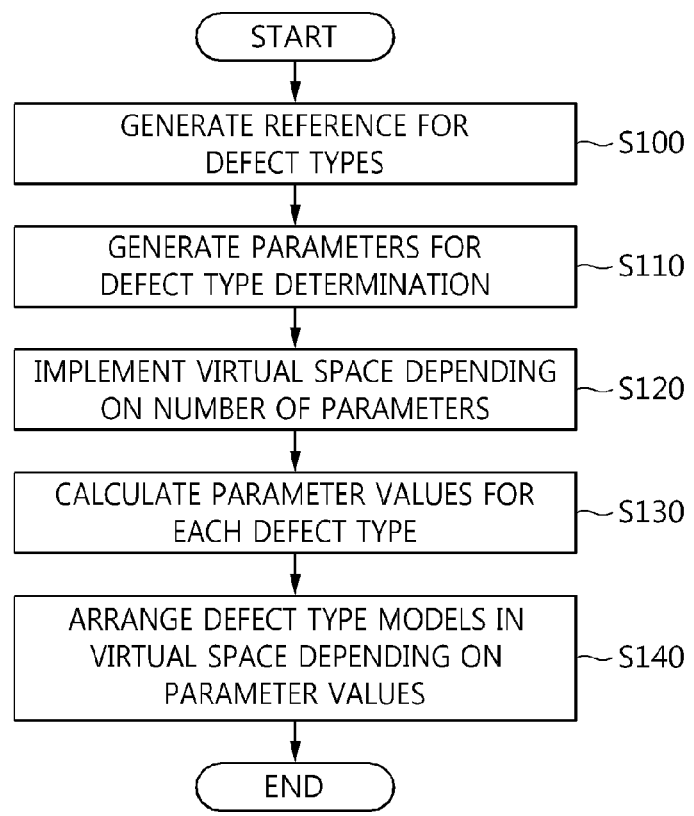
FIGS. 10 and 11 are flowcharts showing the flow of the operation of determining the type of defect in partial discharge according to an embodiment of the present invention.
Figure 11:
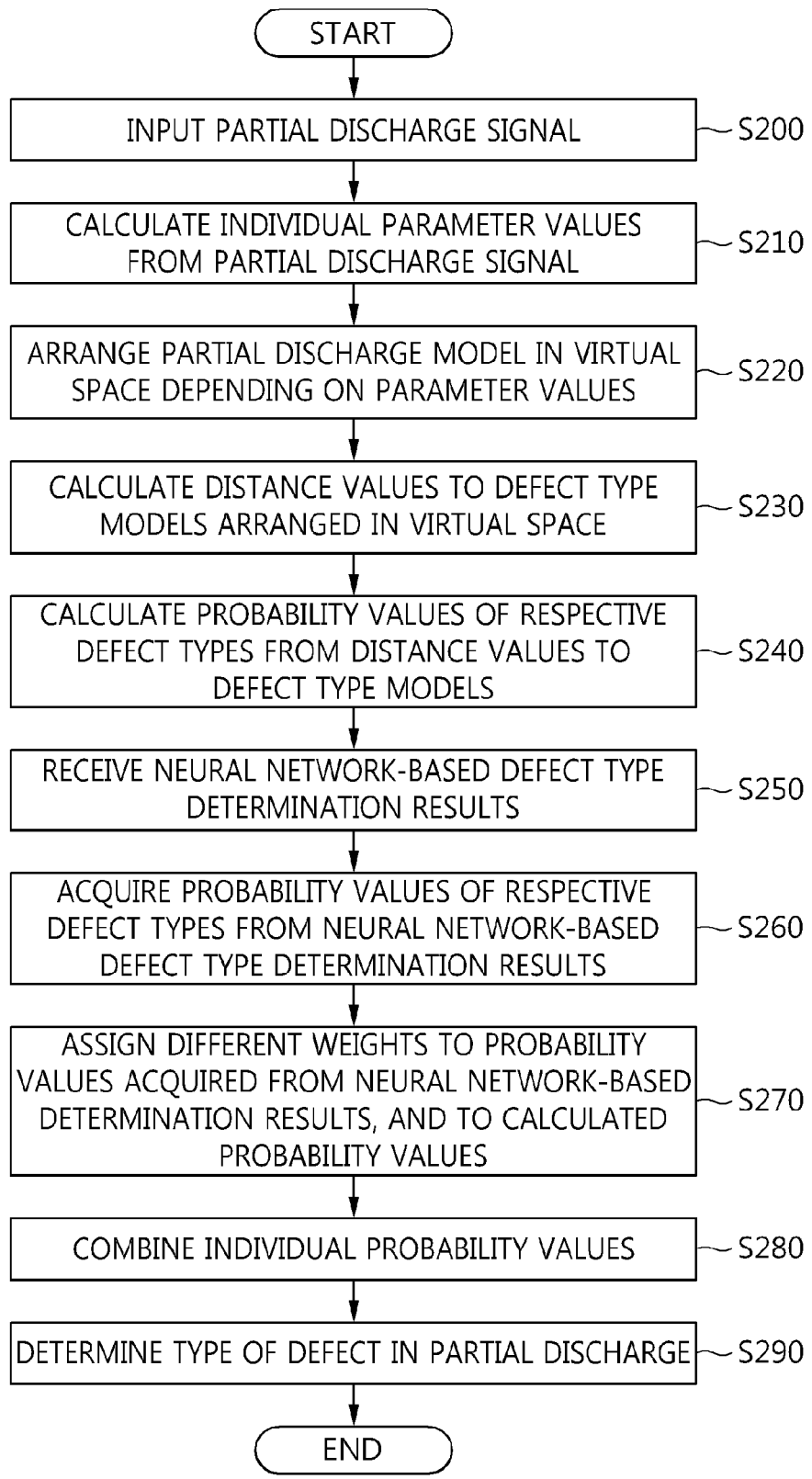

FIGS. 10 and 11 are flowcharts showing the flow of the operation of determining the type of defect in partial discharge according to an embodiment of the present invention.

As shown in FIG. 10, the apparatus for determining the type of defect in partial discharge generates a reference required to determine the type of defect in partial discharge (S100). In this case, the reference may include at least one of references for particles, floating, corona, voids, and noise based on defect types.

The partial discharge defect type determination apparatus generates parameters required to determine the defect type designated at S100 (S110), and implements a virtual space having a number of axes corresponding to the number of parameters generated at S110 (S120).

Further, the partial discharge defect type determination apparatus individually calculates parameter values for the parameters generated at S110 based on a partial discharge signal for defect types, such as particle, floating, corona, void, and noise defects (S130), and combines the individual parameter values and arranges the corresponding parameter type models in the virtual space at S120 (S140).

Thereafter, as shown in FIG. 11, when a partial discharge signal is input (S200), the partial discharge defect type determination apparatus calculates parameter values for the parameters at S110 from the partial discharge signal (S210). The partial discharge defect type determination apparatus arranges a partial discharge model in the virtual space at S120 by combining the individual parameter values calculated at S210 (S220).

In this case, the partial discharge defect type determination apparatus calculates distance values between the individual defect type models arranged in the virtual space at S140 and the partial discharge model (S230), and calculates probability values of respective defect types from the calculated distance values (S240).

Thereafter, the partial discharge defect type determination apparatus receives the results of neural network-based defect type determination (S250), and acquires probability values of the respective defect types from the neural network-based defect type determination results (S260).

Further, the partial discharge defect type determination apparatus assigns different weights to the probability values acquired from the neural network-based determination results and to the probability values calculated at S240 (S270), and combines the probability values acquired from the neural network-based determination results with the probability values calculated at S240 (S280), and thus generates the results of determination in the type of defect in partial discharge (S290).

As described above, although the method and apparatus for determining the type of defect in partial discharge according to an embodiment of the present invention have been described with reference to the illustrated drawings, an embodiment of the present invention is not limited by the embodiments described in the present specification and drawings, and may be modified without departing from the technical spirit of the invention.

The invention claimed is:

1. A method for determining a type of defect in partial discharge, comprising:
    forming a virtual space corresponding to n parameters generated based on defect types causing partial discharge, and arranging defect type models in the virtual space by combining parameter values of the n parameters for each of defect types;
    extracting parameter values corresponding to the n parameters based on a generated partial discharge signal when a partial discharge signal event occurs, combining the parameter values, and then arranging a partial discharge model in the virtual space;
    comparing pieces of location information of the defect type models with location information of the partial discharge model and then calculating distance values between the defect type models and the partial discharge model;
    calculating probability values of the defect types for the partial discharge signal event from the distance values calculated at calculating;
    determining, using a defect type determination unit, a type of defect in the partial discharge signal event based on the probability values of the defect types for the partial discharge signal event; and
    receiving neural network-based defect type determination results for the defect types and the partial discharge signal event,
    wherein determining the type of defect is configured to determine the type of defect in the partial discharge signal event by combining the probability values of the defect types with probability values acquired from the neural network-based defect type determination results, and
    wherein determining the type of defect is further configured to assign different weights to the probability values of the defect types and to the probability values acquired from the neural network-based defect type determination results.

2. The method of claim 1, wherein the virtual space is an n-dimensional space composed of n axes respectively corresponding to the n parameters.

3. The method of claim 1, wherein arranging the defect types comprises:
    arranging the parameter values for each of the defect types in the virtual space and, if the parameter values form groups having predetermined distributions, calculating coordinate values at center locations of the corresponding groups for respective defect types; and
    storing the calculated coordinate values for respective defect types as the pieces of location information of the respective defect type models.

4. The method of claim 1, wherein calculating the probability values of the defect types is configured to calculate a ratio of relative distances for respective defect types based on a total distance value to the defect types, thus calculating the probability values.

5. The method of claim 1, wherein the probability values become higher as the distance values between the partial discharge model and the defect type models are shorter.

6. The method of claim 1, wherein determining the type of defect is further configured to determine the type of defect in the partial discharge signal event by adding up the probability values of the defect types and the probability values acquired from the neural network-based defect type determination results, to which the different weights have been assigned.

7. The method of claim 1, wherein the parameters are generated based on phase, discharge quantity, and a number of discharges of the partial discharge signal measured in correspondence with each of the defect types.

8. The method of claim 1, wherein the parameters are classified into two-dimensional (2D) distributions corresponding to three types including phase-discharge quantity, phase—the number of discharges, and discharge quantity—the number of discharges by using the phase, the discharge quantity, and the number of discharges as variables.

9. The method of claim 8, wherein each of the phase-discharge quantity-type parameters and the phase—the number of discharges-type parameters has phase as a dependent variable, and is then divided into positive and negative parameters.

10. The method of claim 8, wherein the discharge quantity—the number of discharges-type parameters have dependent variables having linear characteristics, and are then normalized by setting a maximum value to 100.

11. The method of claim 1, wherein the type of defect in partial discharge includes at least one of particle, floating, corona, void, and noise defects.

12. An apparatus for determining a type of defect in partial discharge, comprising:
- a virtual space implementation unit for forming a virtual space corresponding to n parameters generated based on defect types causing partial discharge;
- a partial discharge signal analysis unit for, when a partial discharge signal event occurs, extracting parameter values corresponding to the n parameters, based on a generated partial discharge signal;
- a calculation unit for comparing pieces of location information of defect type models, arranged in the virtual space by combining the parameter values of the n parameters for each of the defect types, with location information of a partial discharge model, arranged in the virtual space by combining the parameter values of the n parameters for the partial discharge signal, calculating distance values between the defect type models and the partial discharge model, and calculating probability values of the defect types for the partial discharge signal event from the distance values; and
- a defect type determination unit for determining a type of defect in the partial discharge signal event based on the probability values of the defect types for the partial discharge signal event,
- wherein the defect type determination unit receives neural network-based defect type determination results for the defect types and the partial discharge signal event, and determines the type of defect in the partial discharge signal event by combining the probability values of the defect types with probability values acquired from the neural network-based defect type determination results, and
- wherein the defect type determination unit assigns different weights to the probability values of the defect types and to the probability values acquired from the neural network-based defect type determination results.

13. The apparatus of claim 12, wherein the defect type determination unit determines the type of defect in the partial discharge signal event by adding up the probability values of the defect types and the probability values acquired from the neural network-based defect type determination results, to which the different weights have been assigned.

* * * * *